United States Patent [19]
Odagawa et al.

[11] Patent Number: 5,719,105
[45] Date of Patent: Feb. 17, 1998

[54] SUPERCONDUCTING ELEMENT

[75] Inventors: Akihiro Odagawa; Youichi Enomoto, both of Tokyo; Shuuichi Yoshikawa, Tsukuba, all of Japan

[73] Assignees: International Superconductivity Technology Center; Matsushita Electric Industrial Co., Ltd.; Sanyo Electric Co., Ltd., all of, Japan

[21] Appl. No.: 328,328

[22] Filed: Oct. 24, 1994

[30] Foreign Application Priority Data

Oct. 28, 1993 [JP] Japan ................................ 5-270861

[51] Int. Cl.$^6$ .................. H01L 39/22; H01L 39/00; H01L 39/14; H01L 39/74
[52] U.S. Cl. .................. 505/234; 505/190; 505/329; 505/702; 259/33; 259/34
[58] Field of Search ................... 257/31, 32, 33, 257/34; 505/190, 234, 329, 702

[56] References Cited

U.S. PATENT DOCUMENTS

| | | | |
|---|---|---|---|
| 5,053,383 | 10/1991 | Short et al. | 257/34 |
| 5,140,300 | 8/1992 | Ohno et al. | 338/325 |

FOREIGN PATENT DOCUMENTS

| | | | |
|---|---|---|---|
| 63-291817 | 11/1988 | Japan . | |
| 1-093458 | 4/1989 | Japan . | |
| 1-286928 | 11/1989 | Japan . | |
| 1-286952 | 11/1989 | Japan . | |
| 3-297177 | 12/1991 | Japan ....................... | 257/34 |

OTHER PUBLICATIONS

Lunkenheimer et al., "Frequency Dependent Conductivity in $YBa_2(Cu_{1-x}Zn_x)_3O_n$ Thin Films", Physica C. vol. 201, No. 182, Oct. 10, 1992, pp. 13–20.

Witanachchi et al., "Critical Current Enhancement in Multilayered $Y1Ba2Cu3O7-\gamma/Y1Ba2(Cu1-xNxi)O7-\gamma$ Structures," Applied Physics Letter, vol. 57, No. 20, pp. 2133–2135, Nov. 12, 1990.

Piechota et al., "Magnetic Properties of $YBa2(Cu1-xNix)3O7-\gamma$," Phys. Stat. Sol. (a), vol. 119, pp. 271–278, 1990.

Song et al., "Transport Properties of $YBa2(Cu0.98M0.02)30\gamma(M=Fe, Co, Ni)$ Superconducting Thin Films," Physica C, vol. 174, pp. 303–308, 1991.

Burzo et al., "Magnetic Properties of $YBa2(Cu1-xMx)3O7-\gamma(M=Zn, Ni)$ Superconducting Compounds," Physica C, vol. 235–240, pp. 1589–1590, 1994.

Bichile et al., "Influence of Nickel Substitution on Flux Pinning and Critical Currents in $YBa2Cu3O7-\gamma$," Cryogenics, vol. 31, pp. 833–838, Sep. 1991.

Leo et al., "Influence of Ge, Fe, Zn and Al Substitutions on the Tunneling Characteristics of the Y–Ba–Cu–O System," Solid State Communications, vol. 92, No. 11, pp. 873–875, 1994.

T. Doderer et al, Phys Rev. B vo. 52, No. 1, "Imaging of Electromagnetic Resonances in an $YBa_2 Ca_3 O_{7-\delta}$ Bicrystal Grain–Boundary Josephson Junction," Jul. 1, 1995, pp. 93–95.

M. Suzuki et al. J. Appl. Phys. vol. 56, No. 7, "Study on Grain Boundary Josephson Junctions in $Ba Pb_{1-x} Bi_x O_3$ Thin Film", Oct. 1, 1984, pp. 2083–2092.

*Primary Examiner*—Stephen Meier
*Assistant Examiner*—Alice W. Tang

[57] ABSTRACT

A superconducting element is disclosed which includes a substrate and a superconducting layer provided on the substrate and formed of an oxide having the following chemical formula:

$$RBa_2(Cu_{1-x}M_x)_3O_7$$

wherein R represents at least one element selected from the group consisting of Y, La, Nd, Pm, Sm, Eu, Gd, Dy, Ho, Er, Tm, Yb and Lu, M represents at least one element selected from the group consisting of Al, Ti, V, Cr, Mn, Fe, Co, Ni, Zn and Ga, and x represents a number of less than 1 but greater than 0.

7 Claims, 3 Drawing Sheets

SUPERCONDUCTING ELEMENT

BACKGROUND OF THE INVENTION

This invention relates to a superconducting element and, more specifically, to a superconducting element having an oxide superconductor layer provided on a substrate.

Recent development of oxide superconductors having a superconducting critical temperature (Tc) higher than liquid nitrogen makes it possible to apply the superconductors in a wide variety of fields, one of which is a superconducting element. A number of structures have thus far been proposed for the construction of superconducting elements. Examples of such superconducting elements include a Josephson element having two, slightly connected oxide superconductor sections, a bridge-type Josephson element having two oxide superconducting films interconnected by a narrow necked portion, a step-type Josephson element in which a substrate has a stepped surface provided with an oxide superconducting film, a bicrystal-type Josephson element having a superconducting film provided on two different, interconnected substrates, and a laminate junction-type superconducting element having an intermediate layer of an insulator, semiconductor or metal interposed between an oxide superconductor and another superconductor.

In the known superconducting elements, while a high critical current density is obtainable by using a good quality superconducting layer, it is very difficult to obtain both a high Josephson current (Ic) and a high quasiparticle resistance (Rn) because of a low normal electric conduction resistance. Because a superconducting element having a high Ic×Rn value is advantageously utilizable for micro wave applications, there is a great demand for a superconducting element which can exhibit high Ic×Rn with good reproducibility.

SUMMARY OF THE INVENTION

It is, therefore, an object of the present invention to provide a superconducting element having a high Ic×Rn value.

Another object of the present invention is to provide a superconducting element of the above-mentioned type which can be easily fabricated into any desired junction structure.

In accomplishing the foregoing objects, the present invention provides a superconducting element comprising a substrate and a superconducting layer provided on the substrate, the superconducting layer being formed of an oxide containing an element R which is at least one member selected from the group consisting of Y, La, Nd, Pm, Sm, Eu, Gd, Dy, Ho, Er, Tm, Yb and Lu, Ba, Cu and an element M which is at least one member selected from the group consisting of Al, Ti, V, Cr, Mn, Fe, Co, Ni, Zn and Ga. The oxide has the following chemical formula (I):

$$RBa_2(Cu_{1-x}M_x)_3O_7 \quad (I)$$

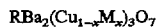

wherein x is a number of less than 1 but greater than 0.

The superconducting layer formed on the substrate is a 123-type R-Ba-Cu-O oxide superconductor in which an element M is substituted for a part of the Cu. By using the specific oxide superconductor, a weak link or barrier may be formed in a micro-order width as the grain boundary junction, so that the superconducting element shows both a high Josephson current (Ic) and a high quasiparticle resistance (Rn). In the formula (I), x is preferably $0<x<0.3$, the element R is preferably Y, and the element M is preferably Ni or Al.

The superconducting element according to the present invention is preferably constructed into a structure in which the superconducting layer has two relatively large width portions which are connected to each other through a relatively narrow necked region serving as a weak link or barrier. In this case, the superconducting element may be constructed into a microbridge-type structure in which the substrate has a flat surface on which the superconducting layer is provided such that the relatively large width portions and the relatively narrow necked portion lie in the same plane. Alternatively, the element may be constructed into a step-type structure in which the substrate has a stepped surface on which the superconducting layer is provided so that the relatively large width portions lie in different planes. The width of the necked portion is generally in the range of 2–5 μm. The superconducting element of the present invention may be constructed into any other desired shape, however.

BRIEF DESCRIPTION OF THE DRAWINGS

Other objects, features and advantages of the invention will become apparent from the detailed description of the preferred embodiment of the present invention which follows, when considered in light of the accompanying drawings, in which.

DETAILED DESCRIPTION OF THE PREFERRED EMBODIMENTS OF THE INVENTION

Any conventionally employed substrate may be used for the purpose of the present invention. Illustrative of suitable substrates are oxide single crystals and oxide polycrystals such as of MgO, $SrTiO_3$, $NdGaO_3$, $LaAlO_3$ and $LaGaO_3$.

On a surface of the substrate, a superconducting layer of an oxide having the above formula (I) is formed by any known manner such as sputtering, vacuum deposition, excimer laser ablation, etc. In the formula (I), x is preferably $0<x<0.3$, the element R is preferably Y, and the element M is preferably Ni or Al.

The superconducting element according to the present invention is utilized for many applications, such as for computers and other electronic devices, as highly sensitive high frequency mixers, power-saving switching elements, superconducting bolometers.

The following examples will further illustrate the present invention.

EXAMPLE 1

Figure 1:
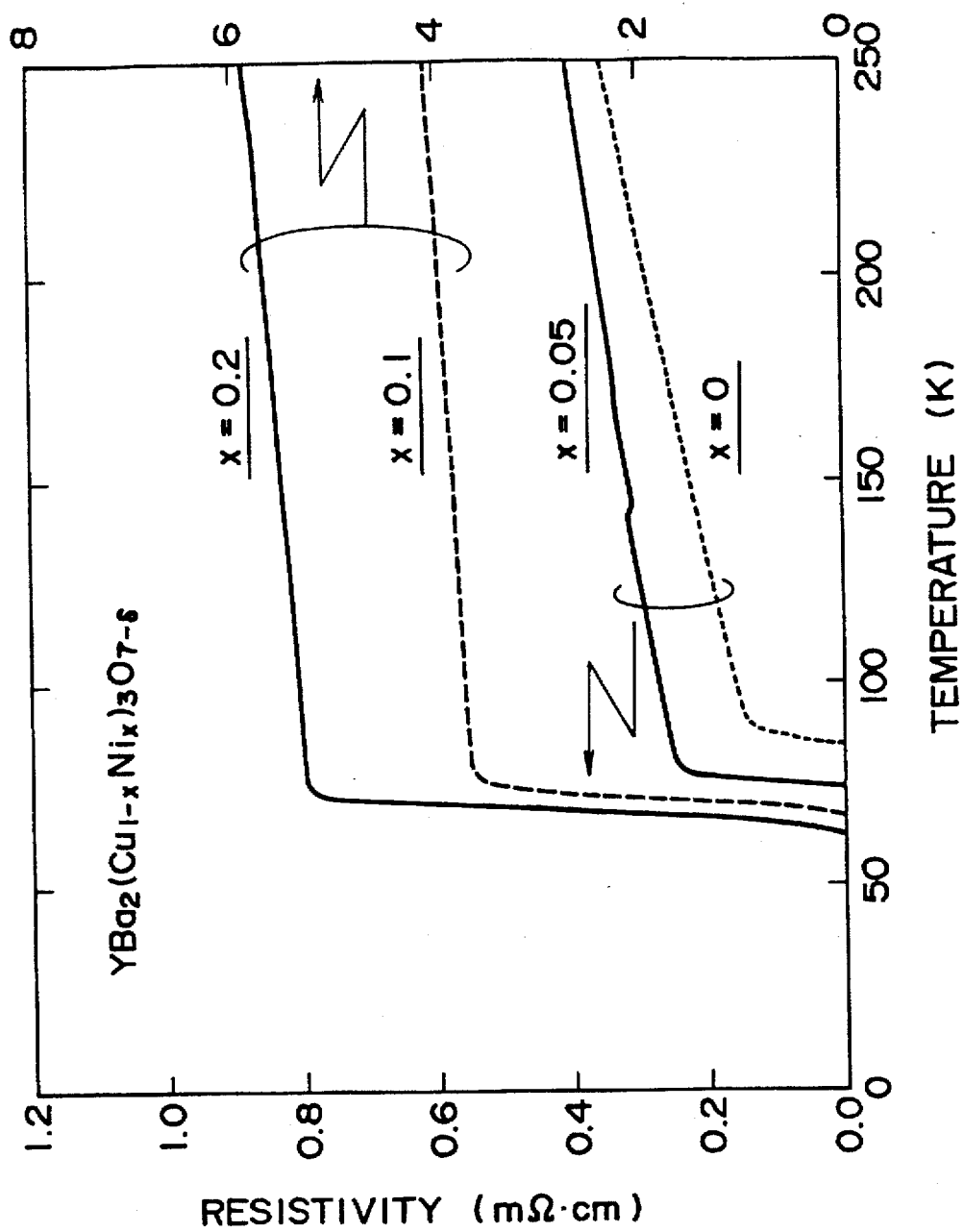
FIG. 1 is a graph showing temperature dependency of the resistivity of $YBa_2(Cu_{1-x}Ni_x)_3O_7$ superconductors prepared in Example 1.
Figure 2:
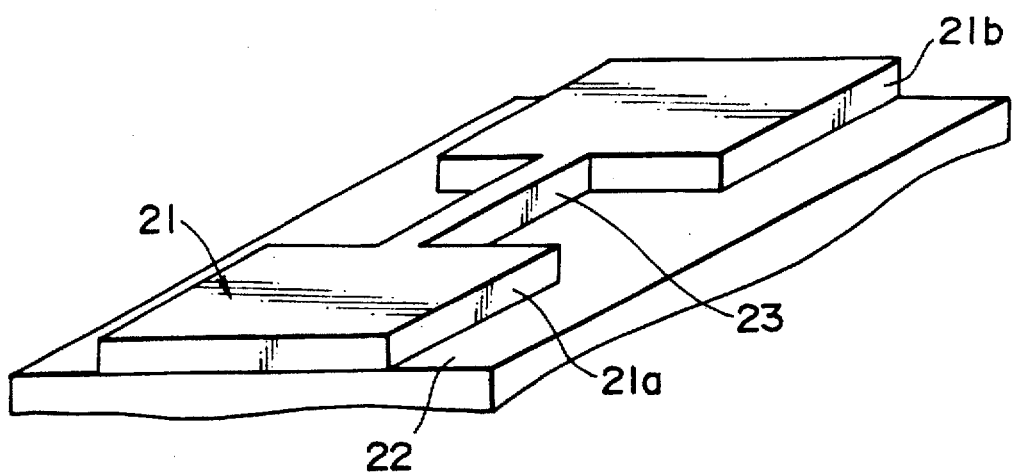
FIG. 2 is a perspective view diagrammatically illustrating a bridge-type superconducting element prepared in Example 1.

$YBa_2(Cu_{1-x}Ni_x)_3O_7$ (x=0, 0.05, 0.1 and 0.2) superconductor films each having a thickness of 300 nm were formed on respective MgO substrates by excimer laser abration, at 750° C. under an oxygen atmosphere of 100 mTorr using KrF excimer laser having a wave length of 248 nm and an energy density of 5 J/cm². Each of the films was C-axis oriented and had a superconducting transition temperature Tc as shown in Table 1. Each film thus prepared was processed by photolithography using a negative resist. This was followed by ion milling and removal of the resist, thereby to form a superconducting film pattern as illustrated in FIG. 2. In FIG. 2, designated as 21 is the superconducting film, as 22 the MgO substrate and as 23 the bridge. As seen from FIG. 2, the superconducting film 21 is composed of two relatively large width (1,000 μm) portions 21a and 21b which lie in the same plane and which are interconnected by the bridge 23 having a relatively small width (2 μm).

Electrical contacts each with a 200 nm thick were then formed on respective large width portions 21a and 21b by vacuum deposition of Au using a metal mask, thereby obtaining four kinds of superconducting elements. These elements were found to show Josephson current (Ic), quasiparticle resistance (Rn) and relative normal conduction resistance (R) as summarized in Table 1. The relative resistance (R) is a ratio of the resistance at a temperature just above Tc of a sample to that of the sample (Sample No. 1) in which no Ni is contained (x=0).

TABLE 1

| Sample No. | x in Formula (I) | Tc (K) | R | Ic (mA) | Rn (ohm) |
| --- | --- | --- | --- | --- | --- |
| 1 | 0 | 87 | 1 | 1.3 | 1 |
| 2 | 0.05 | 78 | about 2 | 1.1 | 2.1 |
| 3 | 0.1 | 75 | about 40 | 1.0 | 5 |
| 4 | 0.2 | 72 | about 60 | 0.55 | 5.6 |

As will be appreciated from the results shown in Table 1, with the increase of the value x, the normal conduction resistance R increases. In case of Sample No. 4 (x=0.2), the normal conduction resistance is about 60 times as high as that of Sample No. 1 (x=0). This increase is considered to be associated with the increase of quasiparticle resistance (Rn). A sample in which x is 0.3 was also prepared in the same manner as described above but is found to exhibit no superconductivity.

Figure 4:
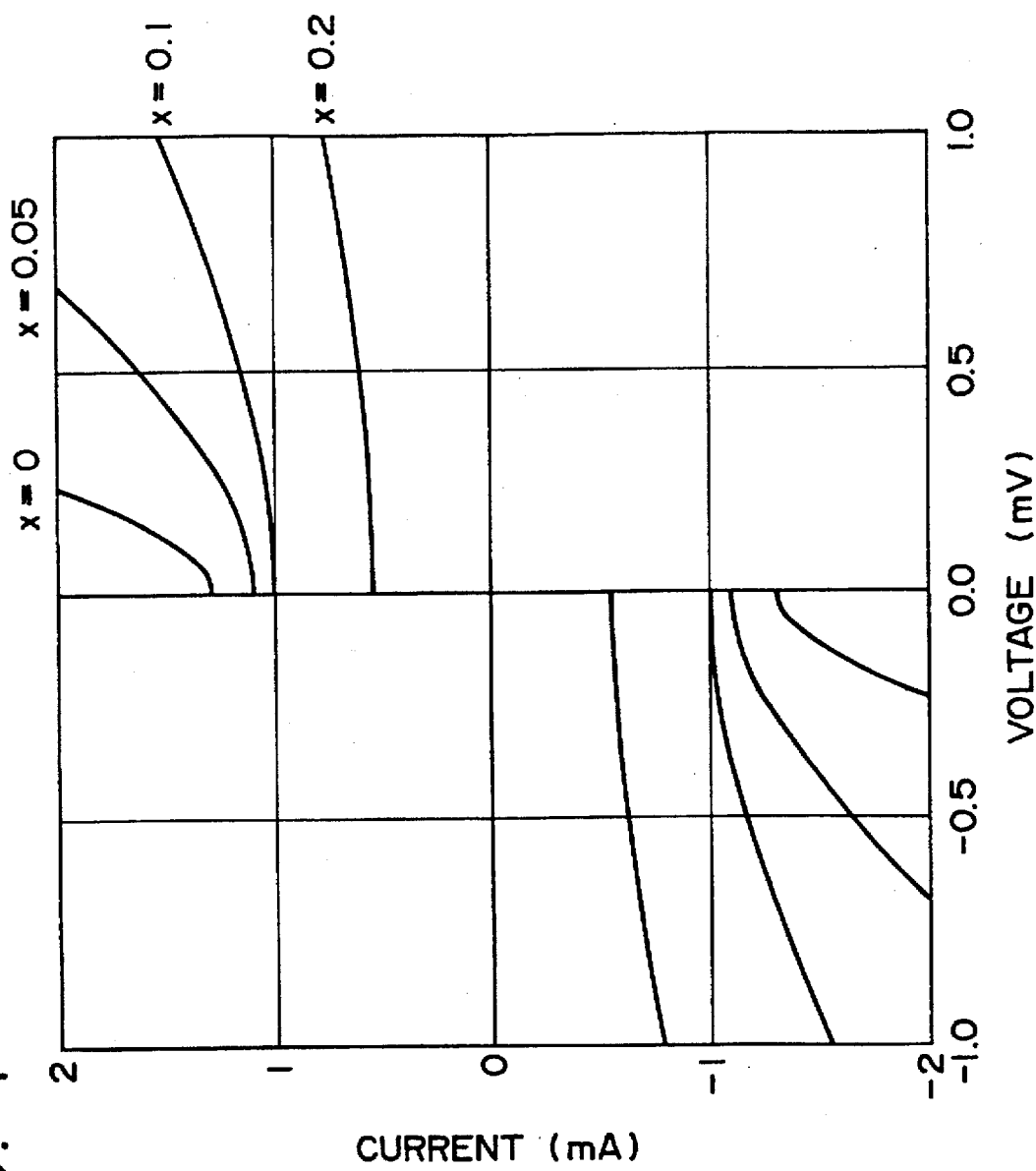
FIG. 4 shows voltage-current characteristics of the superconducting elements prepared in Example 1.

FIG. 4 shows current-voltage characteristics of Samples Nos. 1–4 at 15K. These characteristics are well conformity with the resistively shunted junction (RSJ) model. The superconducting element of Sample No. 3 (x=0.1) provides a superconducting Josephson current of 1.0 mA and has a quasiparticle resistance of 5 ohm and a high (Ic×Rn) value of 5 mV.

EXAMPLE 2

Figure 3:
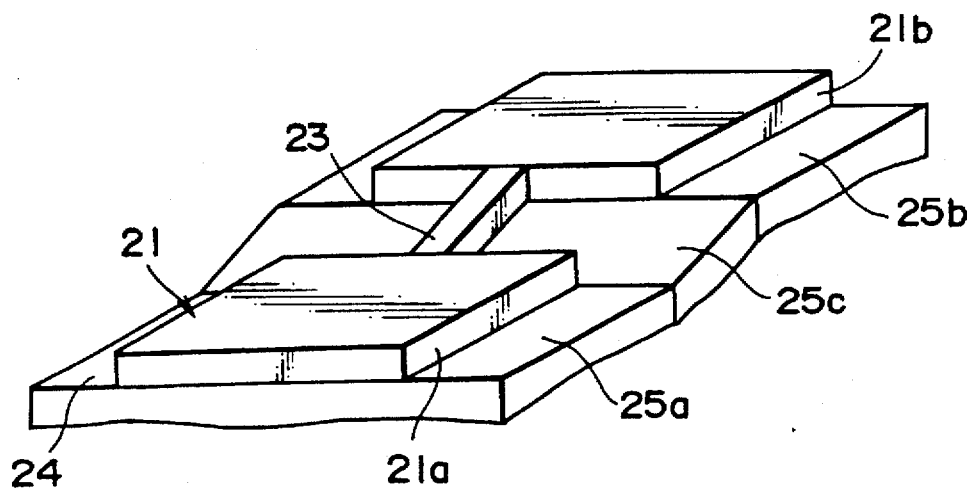
FIG. 3 is a perspective view, similar to FIG. 2, diagrammatically illustrating a step-type superconducting element prepared in Example 1.

Example 1 was repeated in the same manner as above except that a $YBa_2(Cu_{1-x}Ni_x)_3O_7$ superconductor film 21 was formed on a MgO substrate 24 having a step portion (distorted portion) 25c as shown in FIG. 3. The substrate 24 has two portions 25a and 25b which lie in different planes and which are connected to each other by the sloped step 25c. The superconducting film 21 is composed of two relatively large width portions 21a and 21b provided over the surfaces 25a and 25b, respectively, of the substrate 24 and interconnected by a relatively small width portion (bridge) 23 provided over the step 25c. The superconducting element as shown in FIG. 3 in which x is 0.1 gives an (Ic×Rn) product of 4.8 mV.

In the superconducting elements as shown in FIGS. 2 and 3, the relatively large width portions 21a and 21b generally have a width of 100 μm to 1 cm and a thickness of 100 to 500 nm and the relatively small width portion 23 generally has a width of 2–5 μm and a length of 10–50 μm.

EXAMPLE 3

Example 1 was repeated in the same manner as described except that $YBa_2(Cu_{1-x}Al_x)_3O_7$ (x=0, 0.05, 0.1 and 0.2) superconductor films were formed on respective MgO substrates. Each of the films was found to be C-axis oriented and to have a superconducting transition temperature Tc of 68K. Table 2 shows the Josephson current (Ic), quasiparticle resistance (Rn) and relative normal conduction resistance (R) of one of the thus obtained superconducting elements in which x is 0.1. The superconducting element of in which x=0.1 provides a superconducting Josephson current of 0.75 mA and has a quasiparticle resistance of 4.05 ohm and a high (Ic×Rn) value of 3 mV. The current-voltage characteristics are well conformity with the RSJ model. A superconducting element in which x is 0.15 showed a slightly lowered Tc. A sample in which x is 0.3 was also prepared in the same manner as described above but is found to exhibit no superconductivity.

EXAMPLE 4

Example 1 was repeated in the same manner as described except that the superconductor film formed on the MgO substrate was an oxide having a formula $RBa_2(Cu_{1-x}Ni_x)_3O_7$ in which R was a lanthanoid other than Ce, Pr and Tb. Superconducting elements having high (Rn×Ic) products were obtained.

EXAMPLE 5

Example 1 was repeated in the same manner as described except that the superconductor film formed on the MgO substrate was an oxide having a formula $YBa_2(Cu_{1-x}M_x)_3O_7$ in which M was Ti, V, Cr, Mn, Fe, Co, Zn or Ga. The thus obtained superconducting elements had the properties shown in Table 2.

TABLE 2

| Sample No. | M in Formula (I) | Tc (K) | R | Ic (mA) | Rn (ohm) |
| --- | --- | --- | --- | --- | --- |
| 5 | Ti | 75 | about 3 | 1 | 1.5 |
| 6 | V | 80 | about 3 | 1.1 | 1.6 |
| 7 | Cr | 84.5 | about 2 | 1.1 | 1.6 |
| 8 | Mn | 79 | about 3 | 1.1 | 1.5 |
| 9 | Fe | 58 | about 12 | 0.4 | 2.9 |
| 10* | Co | 59 | about 3 | 0.5 | 3.5 |
| 11 | Zn | 52 | about 10 | 0.2 | 3.5 |
| 12 | Ga | 65 | about 9 | 0.35 | 3.7 |
| 13 | Al | 68 | about 22 | 0.75 | 4.05 |

*x = 0.05

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A superconducting element comprising a substrate and a superconducting layer provided on said substrate, said superconducting layer having two relatively large width portions which are connected to each other through a relatively narrow necked region, and said superconducting layer being formed of an oxide having the following chemical formula:

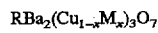

wherein R represents at least one element selected from the group consisting of Y, La, Nd, Pm, Sm, Eu, Gd, Dy, Ho, Er, Tm, Yb and Lu, M is Ni or Al, and x represents a number of less than 0.3 but greater than 0.

2. A superconducting element as claimed in claim 1 wherein said substrate has a flat surface on which said superconducting layer is provided, so that said relatively large width portions and said relatively narrow necked portion lie in the same plane.

3. A superconducting element as claimed in claim 1, wherein said substrate has a stepped surface on which said superconducting layer is provided, so that said relatively large width portions lie in different planes.

4. A superconducting element as claimed in claim 1, wherein said element R is Y.

5. A superconducting element as claimed in claim 1, wherein M is Ni.

6. A superconducting element as claimed in claim 1, wherein said M is Al.

7. A superconducting element as claimed in claim 1 wherein x represents a number of 0.2 or less but greater than 0.

* * * * *